(12) United States Patent
Li

(10) Patent No.: US 12,433,082 B2
(45) Date of Patent: Sep. 30, 2025

(54) FLEXIBLE MICRO-LED DISPLAY PANEL AND MANUFACTURING METHOD THEREOF

(71) Applicant: Shenzhen China Star Optoelectronics Semiconductor Display Technology Co., Ltd., Guangdong (CN)

(72) Inventor: Zhuhui Li, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 759 days.

(21) Appl. No.: 17/417,467

(22) PCT Filed: Dec. 30, 2020

(86) PCT No.: PCT/CN2020/141376
§ 371 (c)(1),
(2) Date: Jun. 23, 2021

(87) PCT Pub. No.: WO2021/244022
PCT Pub. Date: Dec. 9, 2021

(65) Prior Publication Data
US 2022/0336525 A1 Oct. 20, 2022

(30) Foreign Application Priority Data
Jun. 5, 2020 (CN) .......................... 202010507058.0

(51) Int. Cl.
*H01L 27/15* (2006.01)
*H01L 33/56* (2010.01)
(Continued)

(52) U.S. Cl.
CPC ........ *H10H 29/142* (2025.01); *H10D 86/441* (2025.01); *H10D 86/60* (2025.01); *H10H 20/854* (2025.01); *H10H 20/855* (2025.01)

(58) Field of Classification Search
CPC ..... H01L 33/00–648; H01L 27/15–156; H01L 2933/00–0091; H10K 77/111; G02F 1/133305
See application file for complete search history.

(56) References Cited

U.S. PATENT DOCUMENTS

2014/0027709 A1* 1/2014 Higginson ......... H10D 86/0212
438/26
2015/0200238 A1 7/2015 Ko
(Continued)

FOREIGN PATENT DOCUMENTS

CN 104081545 10/2014
CN 105789252 7/2016
(Continued)

OTHER PUBLICATIONS

Shi, Y., Li, Z., Wang, K., et al. (2019), 43-3: 14 Inch Flexible LCD Panel with Colorless Polyimide. SID Symposium Digest of Technical Papers, 50: 597-599. (Year: 2019).*
(Continued)

*Primary Examiner* — Matthew C Landau
*Assistant Examiner* — Nora T. Nix

(57) ABSTRACT

The present application provides a flexible micro-LED display panel and a manufacturing method thereof. The flexible micro-LED display panel includes a first base substrate, a thin film transistor array layer, a first connecting electrode layer, a second connecting electrode layer, a plurality of micro-LED chips, a flexible encapsulation layer, and a second base substrate, wherein the first base substrate and the second base substrate are flexible substrates, the second base substrate is provided on the flexible encapsulation layer covering the micro-LED chips to make a neutral layer of the panel to be located at the thin film transistor array layer, reducing a risk of wiring disconnection.

17 Claims, 5 Drawing Sheets

(51) Int. Cl.
  *H10D 86/40*    (2025.01)
  *H10D 86/60*    (2025.01)
  *H10H 20/854*   (2025.01)
  *H10H 20/855*   (2025.01)
  *H10H 29/14*    (2025.01)

(56) References Cited

U.S. PATENT DOCUMENTS

| | | | |
|---|---|---|---|
| 2018/0337196 A1* | 11/2018 | Yang | H10K 59/131 |
| 2018/0375042 A1* | 12/2018 | Jang | H10K 59/124 |
| 2020/0091199 A1* | 3/2020 | Song | H10D 30/6756 |
| 2022/0045039 A1* | 2/2022 | Tsukamoto | H01L 24/80 |

FOREIGN PATENT DOCUMENTS

| | | |
|---|---|---|
| CN | 106876410 | 6/2017 |
| CN | 107731863 | 2/2018 |
| CN | 108470853 | 8/2018 |
| CN | 111710691 | 9/2020 |

OTHER PUBLICATIONS

Chiba, H., Iwanaga, K., Tokuhisa, K., "Development of a Novel PECVD Precursor, TG-41, for Gas Barrier Film." Tosoh Research & Technology Review, vol. 60, 2016 (Year: 2016).*

Shi, Y., et al. (2019), 43-3: 14 Inch Flexible LCD Panel with Colorless Polyimide. SID Symposium Digest of Technical Papers, 50: 597-599. https://doi.org/10.1002/sdtp.12991 (Year: 2019).*

* cited by examiner

| preparing an array substrate, wherein the array substrate comprises a first base substrate and a thin film transistor array layer formed on the first base substrate; | S10 |

| sequentially forming a first connecting electrode layer, a second connecting electrode layer, and a black matrix layer on the thin film transistor array layer, wherein the first connecting electrode layer and the second connecting electrode layer are electrically connected to each other; | S20 |

| transferring a plurality of micro-LED chips to the second connecting electrode layer, and performing a die bonding process so that the micro-LED chips are connected to the thin film transistor array layer through the first connecting electrode layer and the second connecting electrode layer; | S30 |

| forming a flexible encapsulation layer on the micro-LED chips; and | S40 |

| forming a second base substrate on the flexible encapsulation layer so that a neutral layer of the flexible display panel is located at the thin film transistor array layer. | S50 |

FIG. 2

FLEXIBLE MICRO-LED DISPLAY PANEL AND MANUFACTURING METHOD THEREOF

RELATED APPLICATIONS

This application is a National Phase of PCT Patent Application No. PCT/CN2020/141376 having International filing date of Dec. 30, 2020, which claims the benefit of priority of Chinese Patent Application No. 202010507058.0 filed on Jun. 5, 2020. The contents of the above applications are all incorporated by reference as if fully set forth herein in their entirety.

FIELD AND BACKGROUND OF THE INVENTION

The present application relates to the field of display technology, in particular to a flexible micro-LED display panel and a manufacturing method thereof.

Micro-light emitting diode (micro-LED) display panels have advantages of organic light-emitting diode (OLED) display panels, which are light, thin, flexible, anti-drop, foldable, etc., and also have advantages of a long service life, ultra-low power consumption, fast response times, high transparency, and so on, thus being regarded as a new display technology with the most development potential in a next generation, which is in line with future development trends.

At present, rigid micro-LED display panels developed by many manufacturers have been exhibited. However, flexible micro-LED display panels have many technical defects, and there is still a long way to go before mass production. A main difficulty of flexible micro-LED display panels is reflected in a low yield, which is mainly manifested in huge transfer of micro-LED chips and a proneness to wire disconnection, resulting in higher production costs.

In summary, there is a need to provide a new flexible micro-LED display panel and a manufacturing method thereof to solve the above technical problems.

SUMMARY OF THE INVENTION

A flexible micro-LED display panel and a manufacturing method thereof provided in the present application solve the technical problem that the existing micro-LED display panel is not easy to bend and is prone to wire disconnection, resulting in low product yield.

In order to solve the above problems, the technical solutions provided by the present application are as follows:

The present application provides a flexible micro-LED display panel, including:
an array substrate including a first base substrate and a thin film transistor array layer disposed on the first base substrate;
a first connecting electrode layer disposed on the thin film transistor array layer and electrically connected to the thin film transistor array layer;
a second connecting electrode layer disposed on the first connecting electrode layer;
a plurality of micro-LED chips arranged on the second connecting electrode layer, and connected to the thin film transistor array layer via the first connecting electrode layer and the second connecting electrode layer, wherein a first pin and a second pin are provided on a side of each of the micro-LED chips close to the second connecting electrode layer, and the first pin and the second pin are connected to the second connecting electrode layer to achieve die bonding;
a flexible encapsulation layer covering the micro-LED chips; and
a second base substrate disposed on the flexible encapsulation layer,
wherein the first base substrate and the second base substrate are both flexible substrates, and the second base substrate is configured to control a neutral layer of the flexible display panel to be located at the thin film transistor array layer.

According to the flexible micro-LED display panel provided by the present application, the first base substrate and the second base substrate are made of CPI.

According to the flexible micro-LED display panel provided by the present application, the array substrate further includes:
a barrier layer disposed on the first base substrate;
a light-shielding layer disposed on the barrier layer;
a buffer layer covering the light-shielding layer and the barrier layer;
an active layer disposed on the buffer layer, wherein the light-shielding layer and the active layer are arranged opposite to each other;
a gate insulating layer disposed on the active layer;
a gate layer disposed on the gate insulating layer;
an interlayer dielectric layer covering the gate layer, the active layer, and the buffer layer;
a source and a drain disposed on the interlayer dielectric layer and connected to the active layer;
a passivation layer covering the source, the drain and the interlayer dielectric layer, wherein the first connecting electrode is disposed on the passivation layer; and
a black matrix layer disposed between adjacent ones of the micro-LED chips, wherein the flexible encapsulation layer covers the micro-LED chips, the black matrix layer and the second connecting electrode.

According to the flexible micro-LED display panel provided by the present application, the light-shielding layer, the gate layer, the source, and the drain are made of aluminum-neodymium alloy.

According to the flexible micro-LED display panel provided by the present application, the barrier layer and the flexible encapsulation layer are made of TG-4E polymer.

According to the flexible micro-LED display panel provided by the present application, the active layer is made of IGZO.

According to the flexible micro-LED display panel provided by the present application, a thickness of the second base substrate is 8 um-12 um.

The present application further provides a flexible micro-LED display panel, including:
an array substrate, including a first base substrate and a thin film transistor array layer disposed on the first base substrate;
a first connecting electrode layer disposed on the thin film transistor array layer and electrically connected to the thin film transistor array layer;
a second connecting electrode layer disposed on the first connecting electrode layer;
a plurality of micro-LED chips arranged on the second connecting electrode layer, and connected to the thin film transistor array layer via the first connecting electrode layer and the second connecting electrode layer;
a flexible encapsulation layer covering the micro-LED chips; and a second base substrate disposed on the flexible encapsulation layer,
wherein the first base substrate and the second base substrate are both flexible substrates, and the second base substrate is configured to control a neutral layer of the flexible display panel to be located at the thin film transistor array layer.

According to the flexible micro-LED display panel provided by the present application, the first base substrate and the second base substrate are made of CPI.

According to the flexible micro-LED display panel provided by the present application, the array substrate further includes:
a barrier layer disposed on the first base substrate;
a light-shielding layer disposed on the barrier layer;
a buffer layer covering the light-shielding layer and the barrier layer;
an active layer disposed on the buffer layer, wherein the light-shielding layer and the active layer are arranged opposite to each other;
a gate insulating layer disposed on the active layer;
a gate layer disposed on the gate insulating layer;
an interlayer dielectric layer covering the gate layer, the active layer, and the buffer layer;
a source and a drain disposed on the interlayer dielectric layer and connected to the active layer;
a passivation layer covering the source, the drain and the interlayer dielectric layer, wherein the first connecting electrode is disposed on the passivation layer; and
a black matrix layer disposed between adjacent ones of the micro-LED chips, wherein the flexible encapsulation layer covers the micro-LED chips, the black matrix layer and the second connecting electrode.

According to the flexible micro-LED display panel provided by the present application, the light-shielding layer, the gate layer, the source, and the drain are made of aluminum-neodymium alloy.

According to the flexible micro-LED display panel provided by the present application, the barrier layer and the flexible encapsulation layer are made of TG-4E polymer.

According to the flexible micro-LED display panel provided by the present application, the active layer is made of IGZO.

According to the flexible micro-LED display panel provided by the present application, a thickness of the second base substrate is 8 um-12 um.

The present application also provides a method of manufacturing a flexible micro-LED display panel including the following steps:

S10: preparing an array substrate, wherein the array substrate includes a first base substrate and a thin film transistor array layer formed on the first base substrate;

S20: sequentially forming a first connecting electrode layer, a second connecting electrode layer, and a black matrix layer on the thin film transistor array layer, wherein the first connecting electrode layer and the second connecting electrode layer are electrically connected to each other;

S30: transferring a plurality of micro-LED chips to the second connecting electrode layer, and performing a die bonding process so that the micro-LED chips are connected to the thin film transistor array layer through the first connecting electrode layer and the second connecting electrode layer;

S40: forming a flexible encapsulation layer on the micro-LED chips; and

S50: forming a second base substrate on the flexible encapsulation layer so that a neutral layer of the flexible display panel is located at the thin film transistor array layer.

According to the method of manufacturing the flexible micro-LED display panel provided by the present application, the step S10 includes the following steps:

S101: providing the first base substrate, and sequentially forming a barrier layer, a light-shielding layer, and a buffer layer on the first base substrate; and S102: forming the thin film transistor array layer on the buffer layer, the thin film transistor array layer including an active layer, a gate insulating layer, a gate layer, an interlayer dielectric layer, a source, a drain, and a passivation layer sequentially formed on the buffer layer.

According to the method of manufacturing the flexible micro-LED display panel provided by the present application, the first base substrate and the second base substrate are made of CPI.

According to the method of manufacturing the flexible micro-LED display panel provided by the present application, the light-shielding layer, the gate layer, the source, and the drain are made of aluminum-neodymium alloy.

According to the method of manufacturing the flexible micro-LED display panel provided by the present application, the barrier layer and the flexible encapsulation layer are made of TG-4E polymer.

According to the method of manufacturing the flexible micro-LED display panel provided by the present application, a thickness of the second base substrate is 8 um-12 um.

Beneficial effects of the present application are that: the present application provides a flexible micro-LED display panel and a manufacturing method thereof. By providing a second base substrate on a flexible encapsulation layer covering the micro-LED chip, so that a neutral layer of the flexible micro-LED display panel is located at the thin film transistor array layer, a risk of wire disconnection is reduced. Both the first base substrate and the second base substrate are made of a CPI transparent flexible material. By adopting an IGZO process and an Al—Nd process, and disposing a barrier layer and an encapsulation layer for water and oxygen barrier, it is beneficial to realize flexible display of the micro-LED display panel. The micro-LED display panel provided by the present application has the advantages of high transparency, high response speed, high color gamut, long service life, low power consumption, lightweight, and drop resistance, and thus can be made into a small curvature and can even achieve dynamic bending, which greatly broadens the scope of display applications.

BRIEF DESCRIPTION OF THE SEVERAL VIEWS OF THE DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

FIG. 2 is a flowchart of a method of manufacturing the flexible micro-LED display panel provided by an embodiment of the present application.

DESCRIPTION OF SPECIFIC EMBODIMENTS OF THE INVENTION

Figure 1:
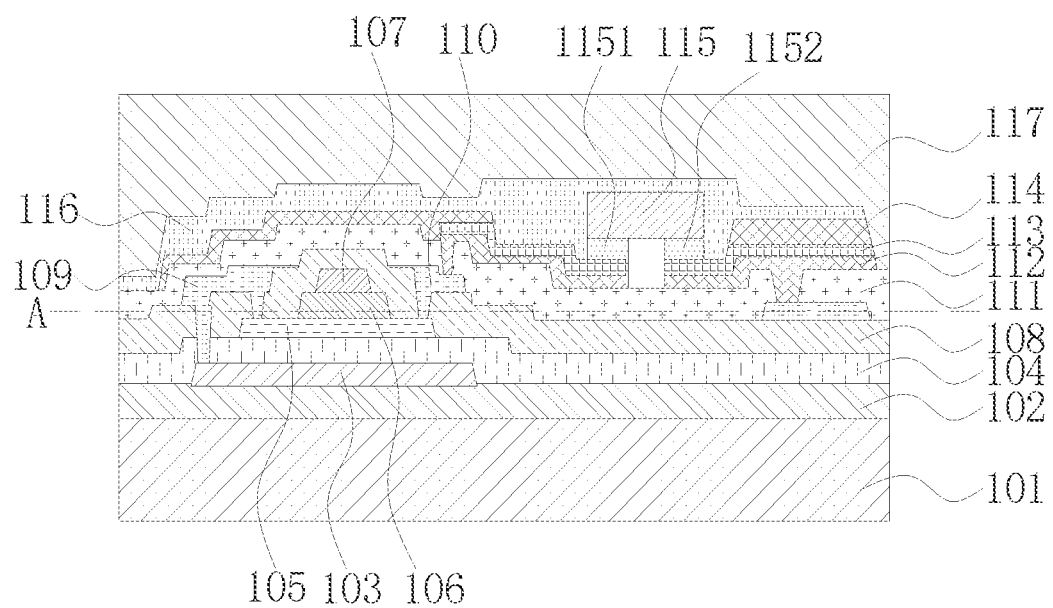
FIG. 1 is a schematic diagram of a cross-sectional structure of a flexible micro-LED display panel provided by an embodiment of the present application.

The following description of the various embodiments is provided to illustrate the specific embodiments of the invention. Directional terms mentioned in the present invention, such as "vertical", "horizontal", "upper", "bottom", "pre", "post", "left", "right", "inside", "outside", "side", etc., only refer to the direction of the additional drawing. Therefore, the directional terminology used is for the purpose of illustration and understanding of the invention. In the drawings, structurally similar elements are denoted by the same reference numerals.

The present application addresses the technical problem that the existing flexible micro-LED display panel is not easy to bend and is prone to wire disconnection, resulting in low product yield. This embodiment can solve this defect.

As shown in FIG. 1, the flexible micro-LED display panel provided by the embodiment of the present application includes an array substrate, a first connecting electrode layer 112, a second connecting electrode layer 113, a plurality of micro-LED chips 115, a flexible encapsulation layer 116, and a second base substrate 117.

The array substrate includes a first base substrate 101 and a thin film transistor array layer disposed on the first base substrate 101. Specifically, the array substrate further includes a barrier layer 102, a light-shielding layer 103, a buffer layer 104, an interlayer dielectric layer 108, a passivation layer 111, and a black matrix layer 114, wherein the thin film transistor array layer includes an active layer 105, a gate insulating layer 106, a gate layer 107, a source 109, and a drain 110.

The first base substrate 101 is a flexible substrate, and the first base substrate 101 may be made of colorless polyimide (CPI). Because CPI material has excellent performance of traditional polyimide including characteristics of high heat resistance, high reliability, resistance to flexure, low density, low dielectric constant, and easy realization of fine pattern circuit processing, it can be applied to flexible display technology of a foldable screen. The barrier layer 102 is disposed on the first base substrate 101 to prevent external moisture or oxygen from corroding the thin film transistor array layer. Optionally, the barrier layer 102 may be made of a composite material such as TG-4E polymer (a high-performance gas barrier material developed by Tosoh Corporation in Japan), which has good water and oxygen barrier properties. The light-shielding layer 103 is disposed on the barrier layer 102, and the light-shielding layer 103 is disposed opposite to the active layer 105, so that ambient light can be effectively blocked to protect the active layer 105. The buffer layer 104 covers the light-shielding layer 103 and the barrier layer 102, and the buffer layer 104 may be made of silicon nitride or silicon oxide material to play a role of buffering and protection.

The active layer 105 is disposed on the buffer layer 104, and the active layer 105 can be made of indium gallium zinc oxide (IGZO) material, which can make the prepared thin film transistor array layer transparent and flexible. The gate insulating layer 106 is disposed on the active layer 105. The gate layer 107 is disposed on the gate insulating layer 106. The interlayer dielectric layer 108 covers the gate layer 107, the active layer 105, and the buffer layer 104, and a material of the interlayer dielectric layer 108 may be silicon oxide, silicon nitride, or silicon oxynitride. The interlayer dielectric layer 108 may be a single-layered structure, such as a single-layered silicon nitride layer, a single-layered silicon oxide layer, etc.; the interlayer dielectric layer 108 may also be a multi-layered structure, such as a stack of silicon nitride and silicon oxide. The source 109 and the drain 110 are disposed on the interlayer dielectric layer 108, and the source 109 and the drain 110 are connected to the active layer 105 through via holes. The passivation layer 111 covers the source 109, the drain 110, and the interlayer dielectric layer 108, and a material of the passivation layer 111 may be silicon nitride or silicon oxide.

Optionally, the light-shielding layer 103, the gate layer 107, the source 109, and the drain 110 are made of aluminum-neodymium alloy. Since the aluminum-neodymium alloy is very suitable for flexible bending, folding performance of the flexible micro-LED display panel can be improved.

The first connecting electrode layer 112 is disposed on the thin film transistor array layer, and is electrically connected to the thin film transistor through a via hole. A material of the first connecting electrode layer 112 may be indium tin oxide (ITO). The second connecting electrode layer 113 is disposed on the first connecting electrode layer 112, and the second connecting electrode layer 113 may be made of a metal material, such as copper.

A plurality of micro-LED chips 115 are disposed on the second connecting electrode layer 113, and the micro-LED chips 115 are connected to the drain 110 of the thin film transistor array layer via the first connecting electrode layer 112 and the second connecting electrode layer 113 to transmit electrical signals from the thin film transistors to the micro-LED chips 115. Specifically, a side of the micro-LED chips 115 close to the second connecting electrode layer 113 is provided with a first pin 1151 and a second pin 1152, and the first pin 1151 and the second pin 1152 as well as the second connecting electrode layer 113 realize die bonding.

The black matrix layer 114 is arranged between adjacent ones of the micro-LED chips 115 to prevent light emitted by adjacent ones of the micro-LED chips 115 from crosstalk.

The flexible encapsulation layer 116 covers the micro-LED chips 115 for encapsulating the micro-LED chips 115. In the embodiment of the present application, the flexible encapsulation layer 116 covers the micro-LED chips 115, the black matrix layer 114, and the second connecting electrode layer 113. Optionally, a material of the flexible encapsulation layer 116 can be a composite material such as TG-4E polymer, which not only has good water and oxygen barrier performance, but also improves the folding performance of the flexible micro-LED display panel.

The second base substrate 117 is disposed directly on the flexible encapsulation layer 116. Optionally, a material of the second base substrate 117 and a material of the first base substrate 101 may be the same and both are CPI material. Since when the flexible micro-LED display panel is folded, metal wiring in the thin film transistor array layer is prone to wire disconnection, it should be noted that a neutral layer A is a surface (layer) formed at all positions where a stress received by the flexible micro-LED display panel during the folding and bending process of the display panel is zero; and at such positions, the metal wiring is not prone to disconnection. Therefore, in an embodiment of the present application, the flexible micro-LED display panel is thickened, and a thickness of the second base substrate 117 can be adjusted to control the neutral layer A of the flexible display panel to be located at the thin film transistor array layer, thereby reducing the risk of metal wiring disconnection when the flexible micro-LED display panel is folded.

Specifically, a thickness of the second base substrate 117 is 8 um to 12 um.

As shown in FIG. 2, an embodiment of the present application also provides a method of manufacturing the flexible micro-LED display panel, which includes the following steps:

S10: preparing an array substrate, wherein the array substrate includes a first base substrate 101 and a thin film transistor array layer formed on the first base substrate 101.

Specifically, the step S10 includes the following steps:

S101: providing the first base substrate 101, and sequentially forming a barrier layer 102, a light-shielding layer 103, and a buffer layer 104 on the first base substrate 101.

Figure 3A:
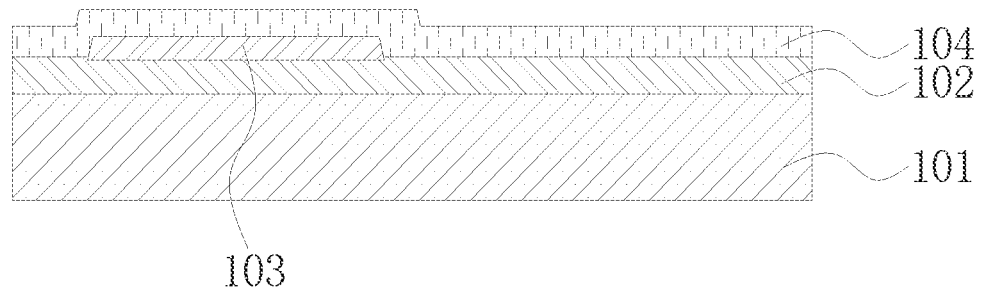
FIGS. 3A, 3B, 3C, 3D, 3E and FIG. 3F are schematic structural diagrams of a flowchart illustrated by structures in the method of manufacturing the flexible micro-LED display panel provided by an embodiment of the present application.

As shown in FIG. 3A, the barrier layer 102, the light-shielding layer 103 having a preset pattern, and the buffer layer 104 covering the light-shielding layer 103 and part of the barrier layer 102 may be formed by using a chemical vapor deposition method or a sputtering process. The process of patterning the light-shielding layer 103 may be wet or dry etching, and a material of the light-shielding layer 103 may be an aluminum-neodymium alloy.

S102: forming the thin film transistor array layer on the buffer layer 104, the thin film transistor array layer including an active layer 105, a gate insulating layer 106, a gate layer 107, an interlayer dielectric layer 108, a source 109, a drain 110, and a passivation layer 111.

Figure 3B:
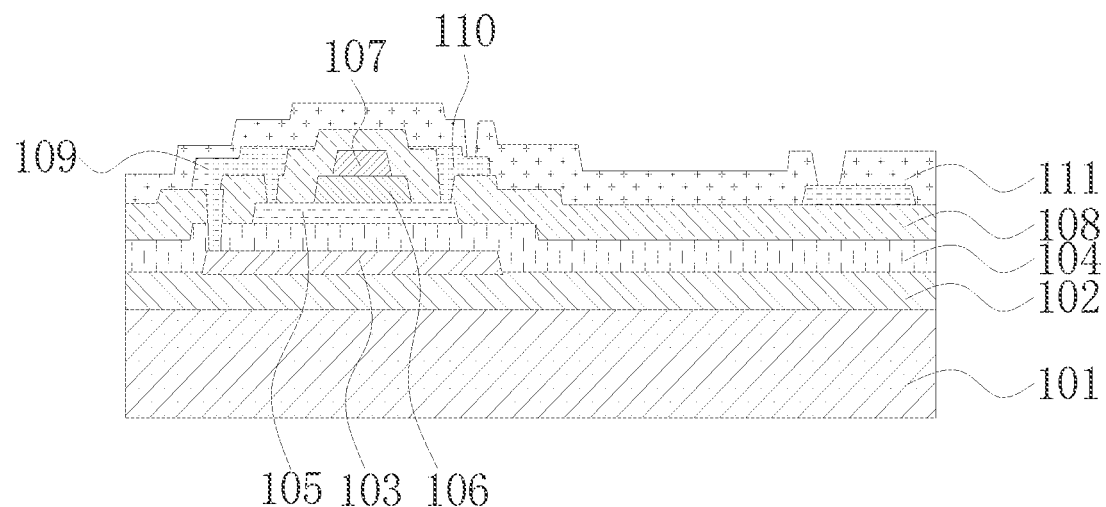

As shown in FIG. 3B, first, the active layer 105, the gate insulating layer 106, the gate layer 107 having a preset pattern, the interlayer dielectric layer 108, the source 109, and the drain 110 may be sequentially formed on a side of the buffer layer 104 away from the first base substrate 101 by chemical vapor deposition or other processes. An orthographic projection of the active layer 105 on the first base substrate 101 is within an orthographic projection of the light-shielding layer 103 on the first base substrate 101, and a material of the active layer 105 may be IGZO. A material of the gate insulating layer 106 may be an insulating material such as silicon oxide and silicon nitride. The gate layer 107, the source 109, and the drain 110 may be made of aluminum-neodymium alloy. A material of the interlayer dielectric layer 108 includes at least one of silicon oxide, silicon nitride, or silicon oxynitride. After that, a passivation layer may be formed on the source 109, the drain 110, and the interlayer dielectric layer 108 sequentially by chemical vapor deposition or other processes, and a via hole penetrating the passivation layer 111 is formed. A material of the passivation layer 111 may be an insulating material such as silicon oxide, silicon nitride, or silicon oxynitride.

S20: sequentially forming a first connecting electrode layer 112, a second connecting electrode layer 113, and a black matrix layer 114 on the thin film transistor array layer, wherein the first connecting electrode layer 112 and the second connecting electrode layer 113 are electrically connected to each other.

Figure 3C:
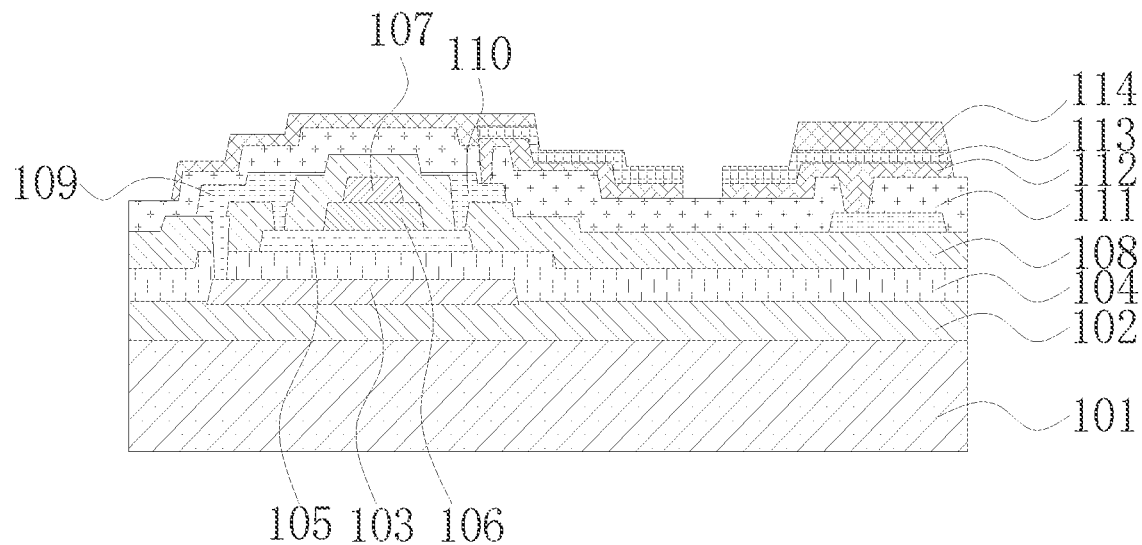

As shown in FIG. 3C, the first connecting electrode layer 112, the second connecting electrode layer 113, and the black matrix layer 114 are sequentially formed on the passivation layer 111. The first connecting electrode layer 112 and the second connecting electrode layer 113 are arranged in different layers. The black matrix layer 114 covers a part of the passivation layer 111 and a part of the second connecting electrode layer 113. The first connecting electrode layer 112 is electrically connected to the drain 110 through the via hole penetrating the passivation layer 111, the first connecting electrode layer 112 may be made ITO, and the second connecting electrode layer 113 may be made of a metal material, such as copper.

S30: transferring a plurality of micro-LED chips 115 to the second connecting electrode layer 113, and performing a die bonding process, so that the micro-LED chips 115 are connected to the thin film transistor array layer through the first connecting electrode layer 112 and the second connecting electrode layer 113.

Figure 3D:
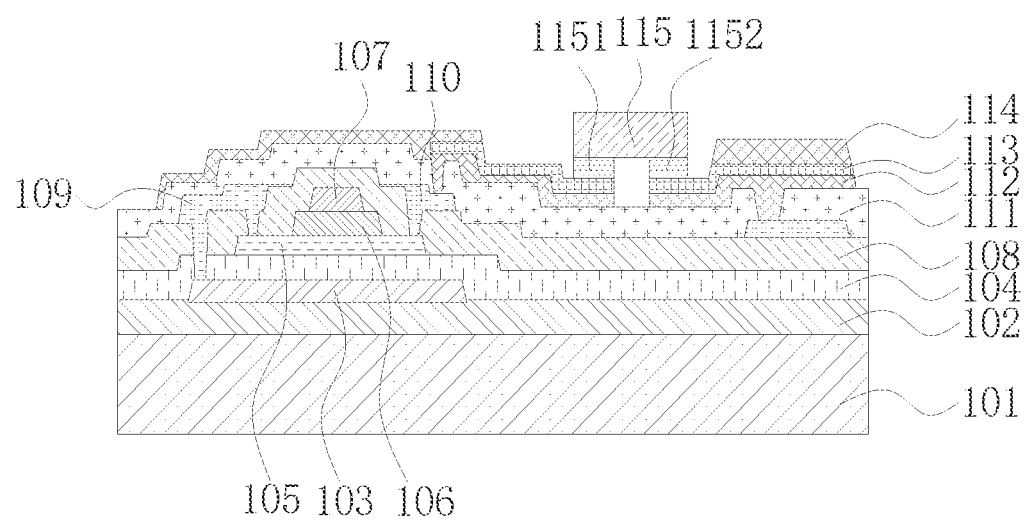

As shown in FIG. 3D, each of the micro-LED chips 115 includes a first pin 1151 and a second pin 1152. The first pin 1151 and the second pin 1152 are electrically connected to the second connecting electrode layer 113, and the black matrix layer 114 is located between adjacent ones of the micro-LED chips 115.

S40: forming a flexible encapsulation layer 116 on the micro-LED chip 115.

Figure 3E:
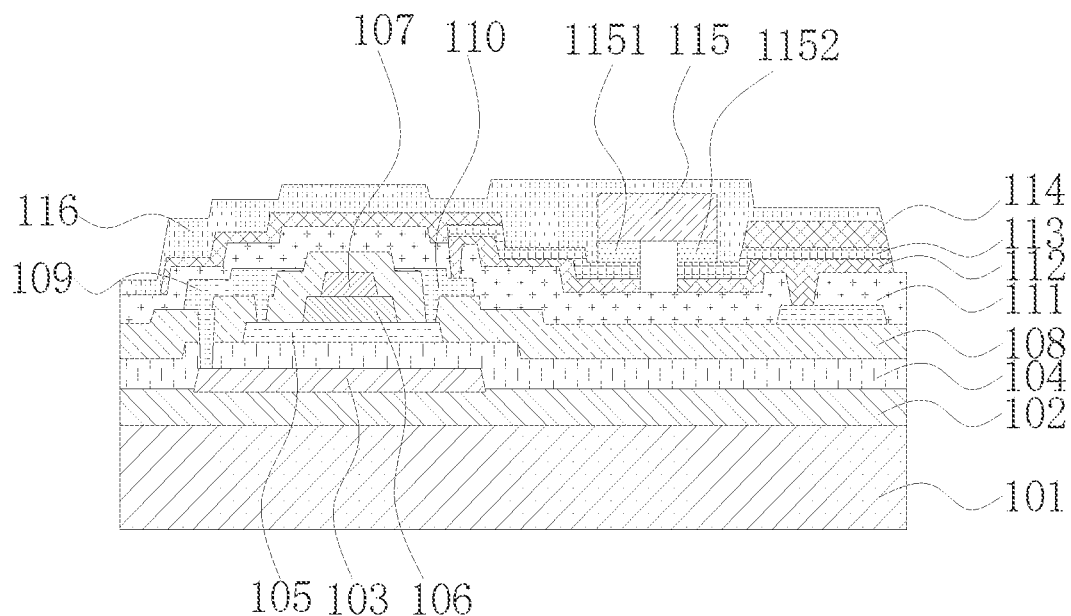

As shown in FIG. 3E, the flexible encapsulation layer 116 is configured to encapsulate the micro-LED chips 115 to prevent the micro-LED chips 115 from being corroded by external water and oxygen. The flexible encapsulation layer 116 is made of a composite material such as TG-41 polymer.

S50: forming a second base substrate 117 directly on the flexible encapsulation layer 116 so that a neutral layer of the flexible micro-LED display panel is located at the thin film transistor array layer.

Figure 3F:
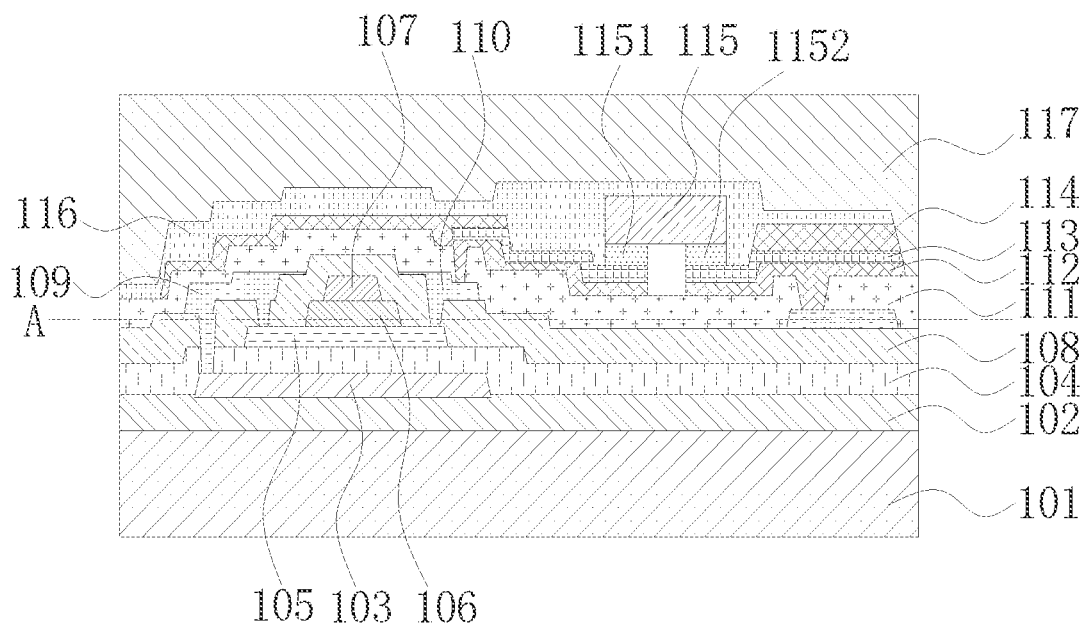

As shown in FIG. 3F, a material of the second base substrate 117 may be CPI, and a thickness of the second base substrate 117 is 8 um to 12 um. The thickness of the second base substrate 117 can be adjusted to make the neutral layer of the flexible micro-LED display panel to be located at the thin film transistor array layer to reduce the risk of metal wiring disconnection.

Beneficial effects are that: the present application provides a flexible micro-LED display panel and a manufacturing method thereof. By providing a second base substrate on a flexible encapsulation layer covering the micro-LED chip, so that the flexible micro-LED display panel is thickened and a neutral layer of the flexible micro-LED display panel is located at the thin film transistor array layer, a risk of wire disconnection is reduced. Both the first base substrate and the second base substrate are made of a CPI transparent flexible material. By adopting an IGZO process and an Al—Nd process, and disposing a barrier layer and an encapsulation layer for water and oxygen barrier, it is beneficial to realize flexible display of the micro-LED display panel. The micro-LED display panel provided by the present application has the advantages of high transparency, fast response times, high color gamut, long service life, low power consumption, lightweight, and drop resistance, and thus can be made into a small curvature and can even achieve dynamic bending, which greatly broadens the scope of display applications.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A flexible micro-LED display panel, comprising:
an array substrate, comprising a first base substrate and a thin film transistor array layer disposed on the first base substrate;
a first connecting electrode layer, disposed on the thin film transistor array layer and electrically connected to the thin film transistor array layer;
a second connecting electrode layer, disposed on the first connecting electrode layer;
a plurality of micro-LED chips, arranged on the second connecting electrode layer, and connected to the thin film transistor array layer via the first connecting electrode layer and the second connecting electrode layer, wherein a first pin and a second pin are provided on a side of each of the micro-LED chips close to the second connecting electrode layer, and the first pin and the second pin are connected to the second connecting electrode layer to achieve die bonding;
a flexible encapsulation layer, covering the micro-LED chips; and
a second base substrate, disposed on the flexible encapsulation layer and being directly in contact with the flexible encapsulation layer,
wherein the first base substrate and the second base substrate are both flexible substrates, the flexible display panel has a neutral layer located at the thin film transistor array layer, and the neutral layer is an imaginary horizontal line at which a stress received by the flexible micro-LED display panel during folding and bending is zero; and
wherein the first base substrate and the second base substrate are respectively located on two opposite sides of a combined structure of the micro-LED chips and the flexible encapsulation layer.

2. The flexible micro-LED display panel according to claim 1, wherein the first base substrate and the second base substrate are made of CPI.

3. The flexible micro-LED display panel according to claim 1, wherein the array substrate further comprises:
a barrier layer, disposed on the first base substrate;
a light-shielding layer, disposed on the barrier layer;
a buffer layer, covering the light-shielding layer and the barrier layer;
an active layer, disposed on the buffer layer, wherein the light-shielding layer and the active layer are arranged opposite to each other;
a gate insulating layer, disposed on the active layer;
a gate layer, disposed on the gate insulating layer;
an interlayer dielectric layer, covering the gate layer, the active layer, and the buffer layer;
a source and a drain, disposed on the interlayer dielectric layer and connected to the active layer;
a passivation layer, covering the source, the drain, and the interlayer dielectric layer, wherein the first connecting electrode is disposed on the passivation layer; and
a black matrix layer, disposed between adjacent ones of the micro-LED chips, wherein the flexible encapsulation layer covers the micro-LED chips, the black matrix layer, and the second connecting electrode.

4. The flexible micro-LED display panel according to claim 3, wherein the light-shielding layer, the gate layer, the source, and the drain are made of aluminum-neodymium alloy.

5. The flexible micro-LED display panel according to claim 3, wherein the active layer is made of IGZO.

6. The flexible micro-LED display panel according to claim 1, wherein a thickness of the second base substrate ranges from 8 μm to 12 μm.

7. A flexible micro-LED display panel, comprising:
an array substrate, comprising a first base substrate and a thin film transistor array layer disposed on the first base substrate;
a first connecting electrode layer, disposed on the thin film transistor array layer and electrically connected to the thin film transistor array layer;
a second connecting electrode layer, disposed on the first connecting electrode layer;
a plurality of micro-LED chips, arranged on the second connecting electrode layer, and connected to the thin film transistor array layer via the first connecting electrode layer and the second connecting electrode layer;
a flexible encapsulation layer, covering the micro-LED chips; and
a second base substrate, disposed on the flexible encapsulation layer and being directly in contact with the flexible encapsulation layer,
wherein the first base substrate and the second base substrate are both flexible substrates, the flexible display panel has a neutral layer located at the thin film transistor array layer, and the neutral layer is an imaginary horizontal line at which a stress received by the flexible micro-LED display panel during folding and bending is zero; and
wherein the first base substrate and the second base substrate are respectively located on two opposite sides of a combined structure of the micro-LED chips and the flexible encapsulation layer.

8. The flexible micro-LED display panel according to claim 7, wherein the first base substrate and the second base substrate are made of CPI.

9. The flexible micro-LED display panel according to claim 7, wherein the array substrate further comprises:
a barrier layer, disposed on the first base substrate;
a light-shielding layer, disposed on the barrier layer;
a buffer layer, covering the light-shielding layer and the barrier layer;
an active layer, disposed on the buffer layer, wherein the light-shielding layer and the active layer are arranged opposite to each other;
a gate insulating layer, disposed on the active layer;
a gate layer, disposed on the gate insulating layer;
an interlayer dielectric layer, covering the gate layer, the active layer, and the buffer layer;
a source and a drain, disposed on the interlayer dielectric layer and connected to the active layer;
a passivation layer, covering the source, the drain, and the interlayer dielectric layer, wherein the first connecting electrode is disposed on the passivation layer; and
a black matrix layer, disposed between adjacent ones of the micro-LED chips, wherein the flexible encapsulation layer covers the micro-LED chips, the black matrix layer, and the second connecting electrode.

10. The flexible micro-LED display panel according to claim 9, wherein the light-shielding layer, the gate layer, the source, and the drain are made of aluminum-neodymium alloy.

11. The flexible micro-LED display panel according to claim 9, wherein the active layer is made of IGZO.

12. The flexible micro-LED display panel according to claim 7, wherein a thickness of the second base substrate ranges from 8 μm to 12 μm.

13. A method of manufacturing a flexible micro-LED display panel, comprising following steps:
  preparing an array substrate, wherein the array substrate comprises a first base substrate and a thin film transistor array layer formed on the first base substrate;
  sequentially forming a first connecting electrode layer, a second connecting electrode layer, and a black matrix layer on the thin film transistor array layer, wherein the first connecting electrode layer and the second connecting electrode layer are electrically connected to each other;
  transferring a plurality of micro-LED chips to the second connecting electrode layer, and performing a die bonding process so that the micro-LED chips are connected to the thin film transistor array layer through the first connecting electrode layer and the second connecting electrode layer;
  forming a flexible encapsulation layer on the micro-LED chips; and
  forming a second base substrate directly on the flexible encapsulation layer, so that the flexible display panel has a neutral layer located at the thin film transistor array layer, wherein the neutral layer is an imaginary horizontal line at which a stress received by the flexible micro-LED display panel during folding and bending is zero; and
  wherein the first base substrate and the second base substrate are both flexible substrates; and
  wherein the first base substrate and the second base substrate are respectively located on two opposite sides of a combined structure of the micro-LED chips and the flexible encapsulation layer.

14. The method of manufacturing the flexible micro-LED display panel according to claim 13, wherein preparing the array substrate comprises:
  providing the first base substrate, and sequentially forming a barrier layer, a light-shielding layer, and a buffer layer on the first base substrate; and
  forming the thin film transistor array layer on the buffer layer, the thin film transistor array layer comprising an active layer, a gate insulating layer, a gate layer, an interlayer dielectric layer, a source, a drain, and a passivation layer sequentially formed on the buffer layer.

15. The method of manufacturing the flexible micro-LED display panel according to claim 13, wherein the first base substrate and the second base substrate are made of CPI.

16. The method of manufacturing the flexible micro-LED display panel according to claim 13, wherein the light-shielding layer, the gate layer, the source, and the drain are made of aluminum-neodymium alloy.

17. The method of manufacturing the flexible micro-LED display panel according to claim 13, wherein a thickness of the second base substrate ranges from 8 μm to 12 μm.

* * * * *